United States Patent
Yeh et al.

(10) Patent No.: US 9,224,750 B1
(45) Date of Patent: Dec. 29, 2015

(54) MULTI-LAYER MEMORY ARRAY AND MANUFACTURING METHOD OF THE SAME

(71) Applicant: Macronix International Co., Ltd., Hsinchu (TW)

(72) Inventors: Teng-Hao Yeh, Hsinchu (TW); Chih-Wei Hu, Toufen Township (TW); Yen-Hao Shih, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/296,173

(22) Filed: Jun. 4, 2014

(51) Int. Cl.
*H01L 27/10* (2006.01)
*H01L 27/115* (2006.01)
*H01L 29/40* (2006.01)

(52) U.S. Cl.
CPC ........ *H01L 27/11582* (2013.01); *H01L 29/401* (2013.01)

(58) Field of Classification Search
CPC .......................... H01L 23/528; H01L 25/0657
USPC ........................................... 257/211; 438/128
See application file for complete search history.

(56) References Cited

U.S. PATENT DOCUMENTS

| 7,081,377 B2 * | 7/2006 | Cleeves | 438/131 |
| 2009/0184360 A1 * | 7/2009 | Jin et al. | 257/319 |

OTHER PUBLICATIONS

Seto, John Y.W., "Annealing Characteristics of Boron- and Phosphorus-Implanted Polycrystalline Silicon", Journal of Applied Physics. vol. 47, No. 12, Dec. 1976, pp. 5167-5170.
Kim, Bio et al., "Investigation of Ultra Thin Polycrystalline Silicon Channel for Vertical NAND Flash", 2011 IEEE, pp. 2E.4.1-2E.4.4.

* cited by examiner

*Primary Examiner* — Theresa T Doan
(74) *Attorney, Agent, or Firm* — Finnegan, Henderson, Farabow, Garrett & Dunner LLP

(57) ABSTRACT

A memory array includes a plurality of ridge-shaped multi-layer stacks extending along a first direction, and a hard mask layer formed on top of the plurality of ridge-shaped multi-layer stacks. The hard mask layer includes a plurality of stripes vertically aligned with the plurality of ridge-shaped multi-layer stacks, respectively, a plurality of bridges connecting adjacent ones of the stripes along a second direction orthogonal to the first direction, and a plurality of hard mask through holes between the plurality of bridges and the plurality of stripes.

9 Claims, 16 Drawing Sheets

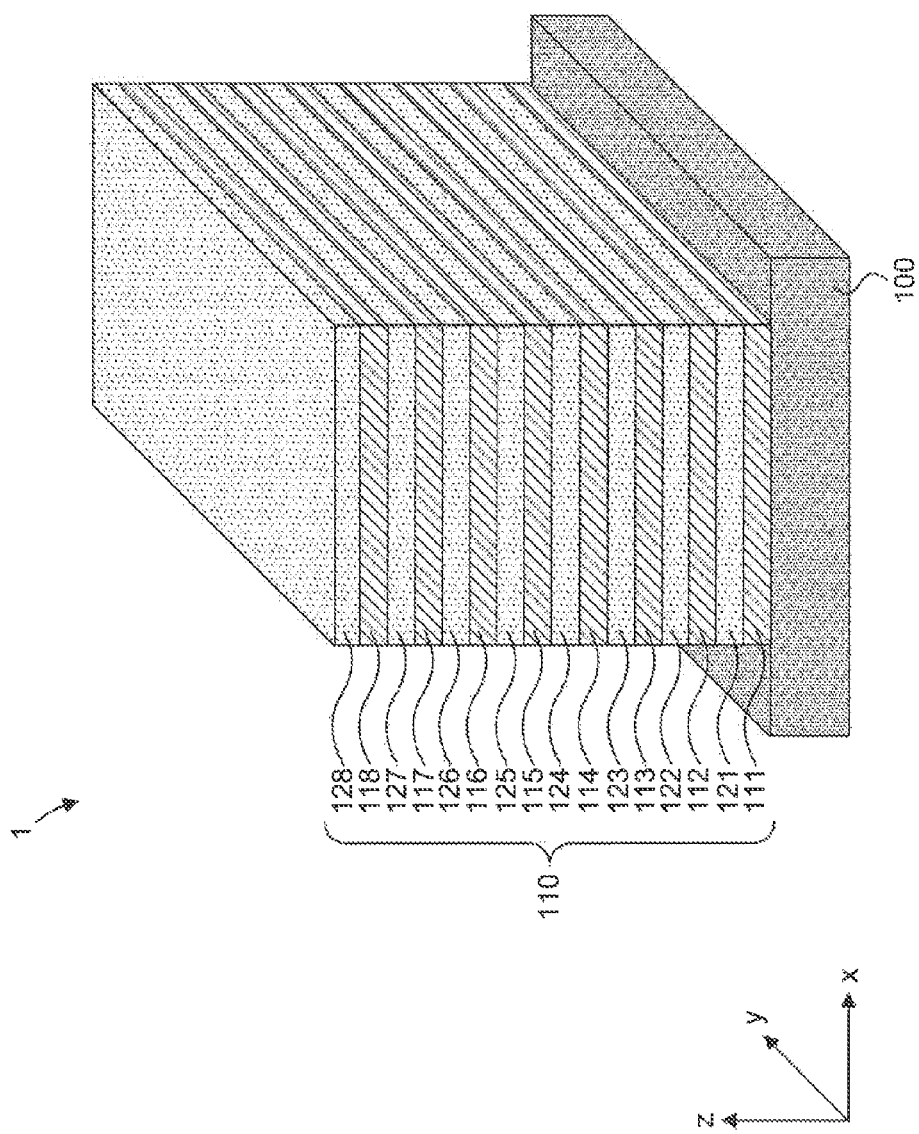

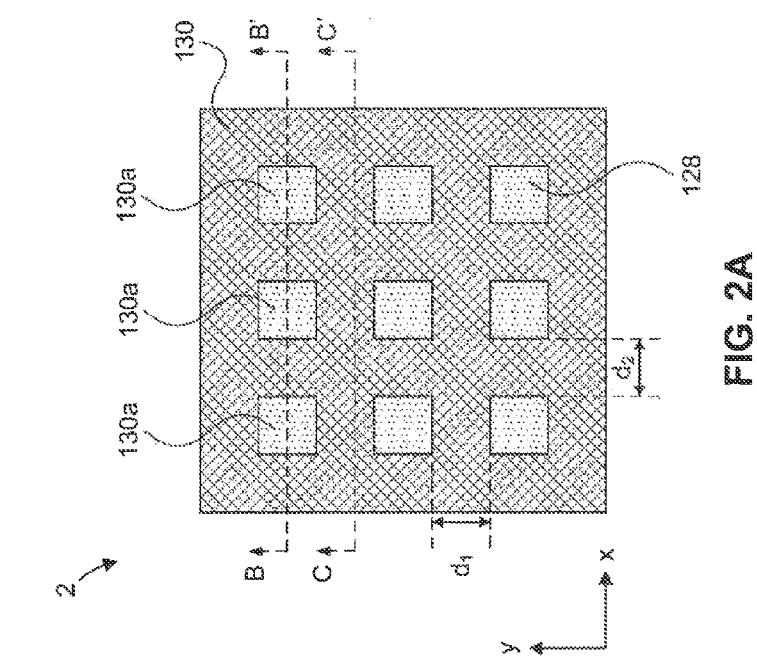
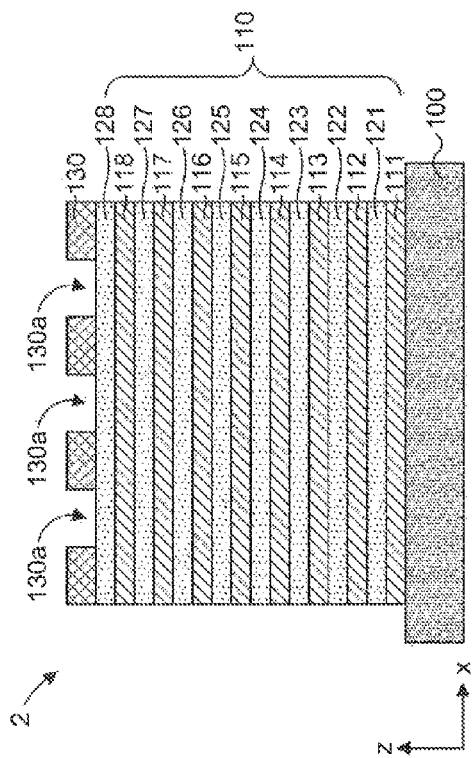
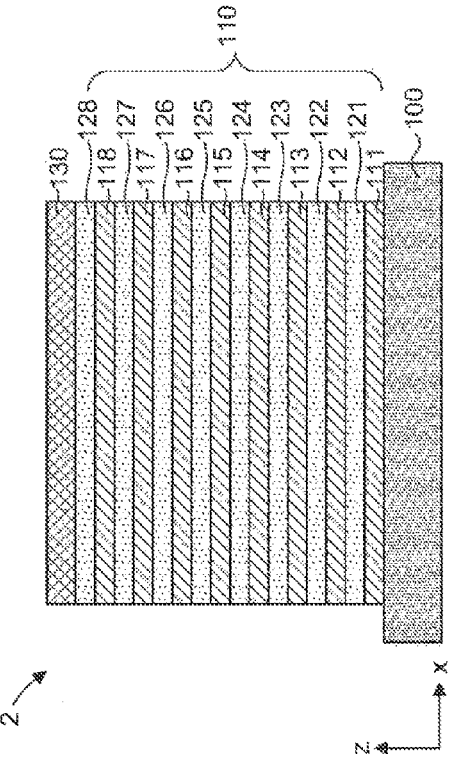
FIG. 2A
FIG. 2B
FIG. 2C

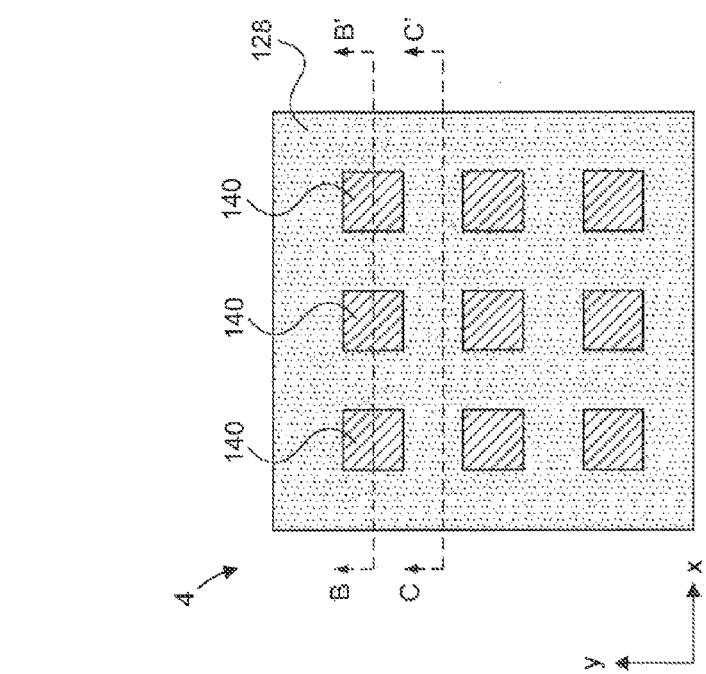
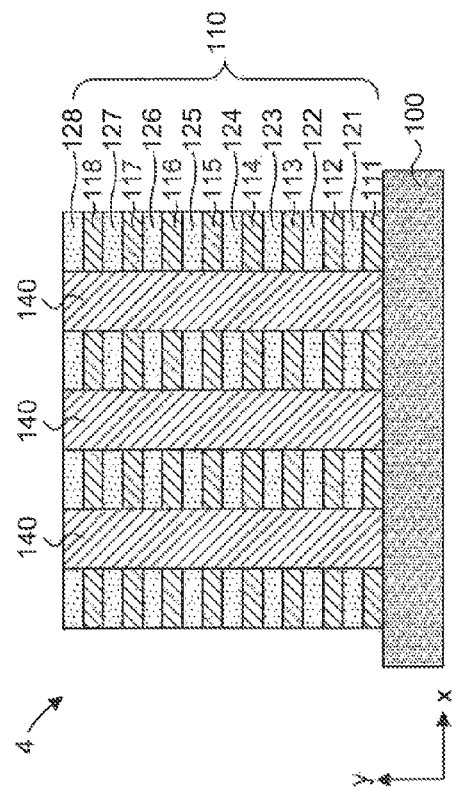
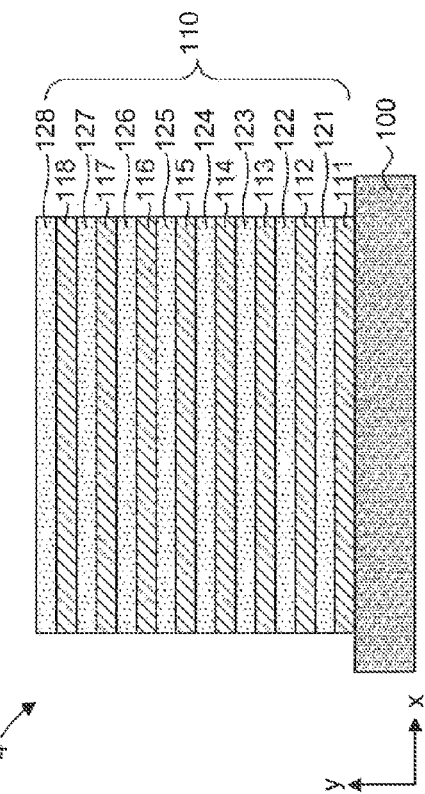

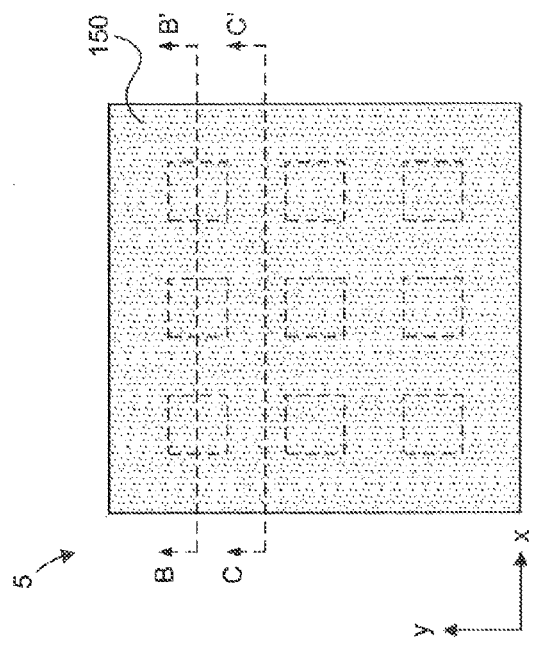
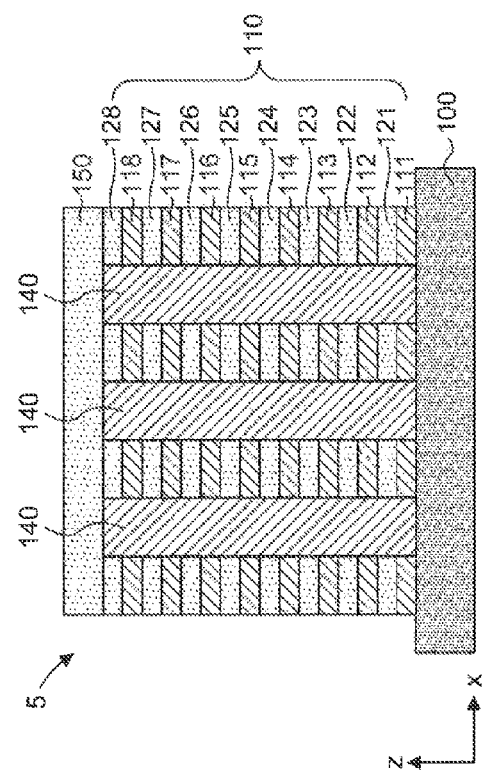
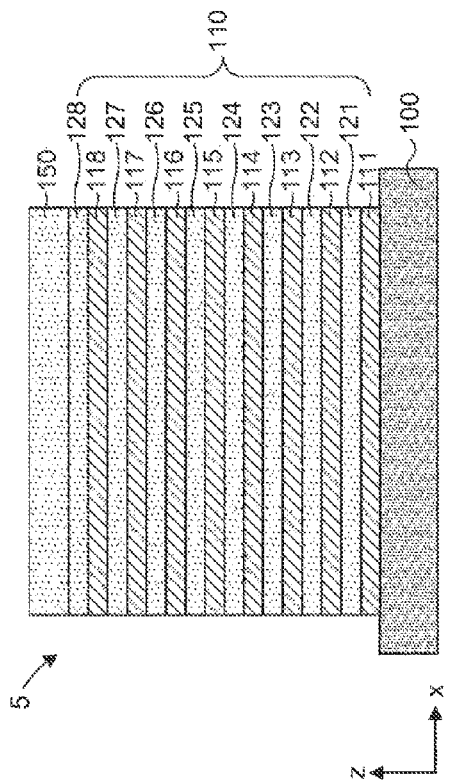

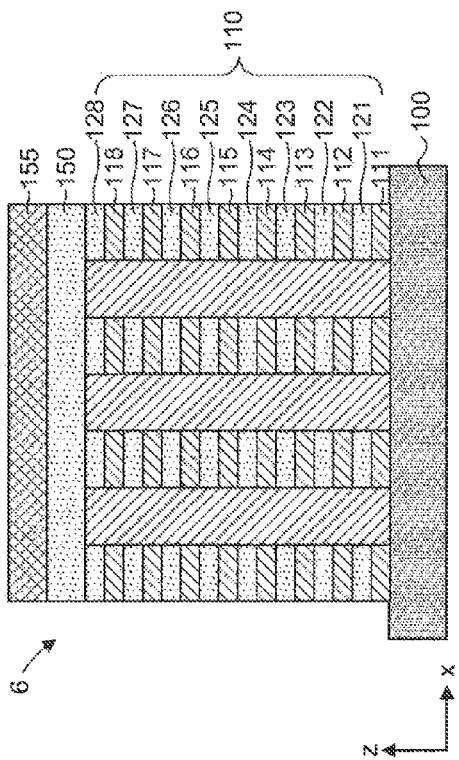
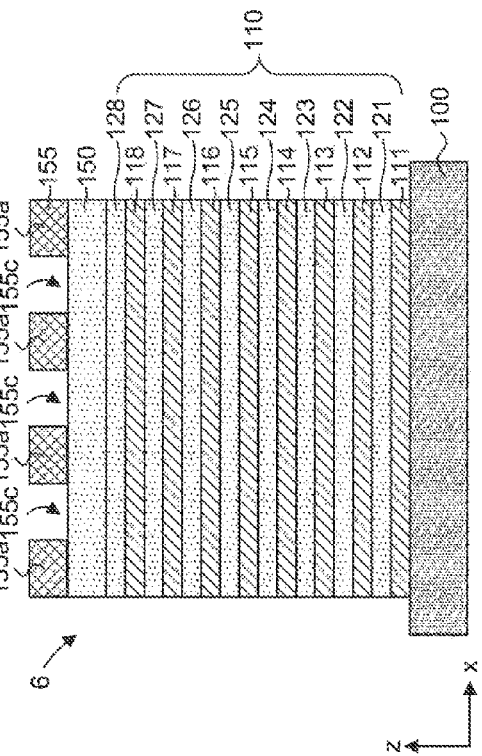
FIG. 6A
FIG. 6B
FIG. 6C

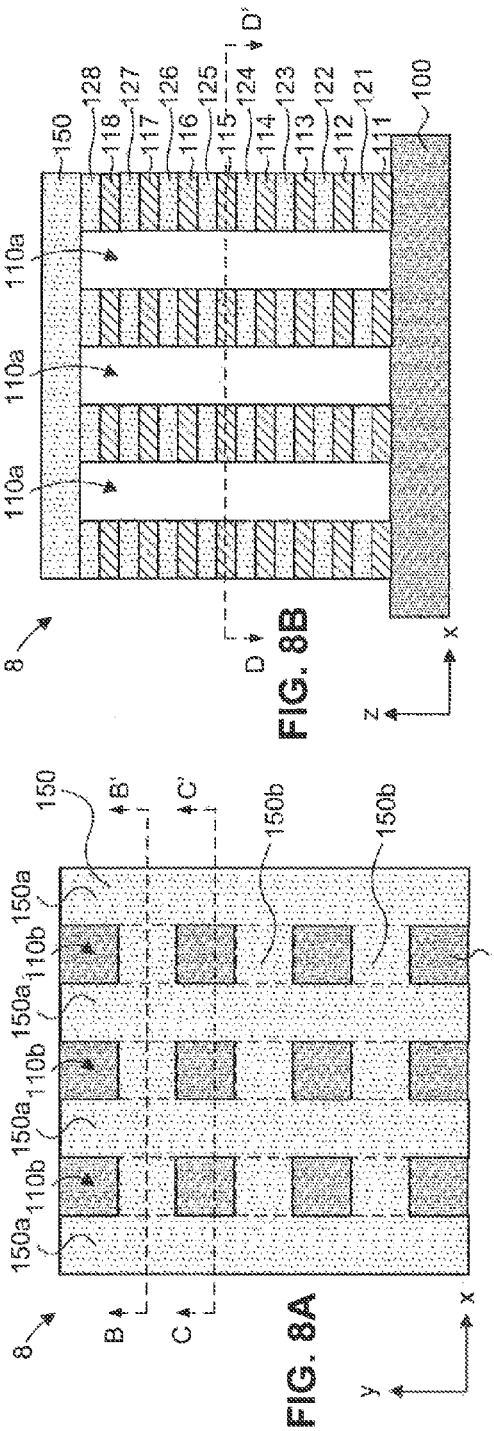
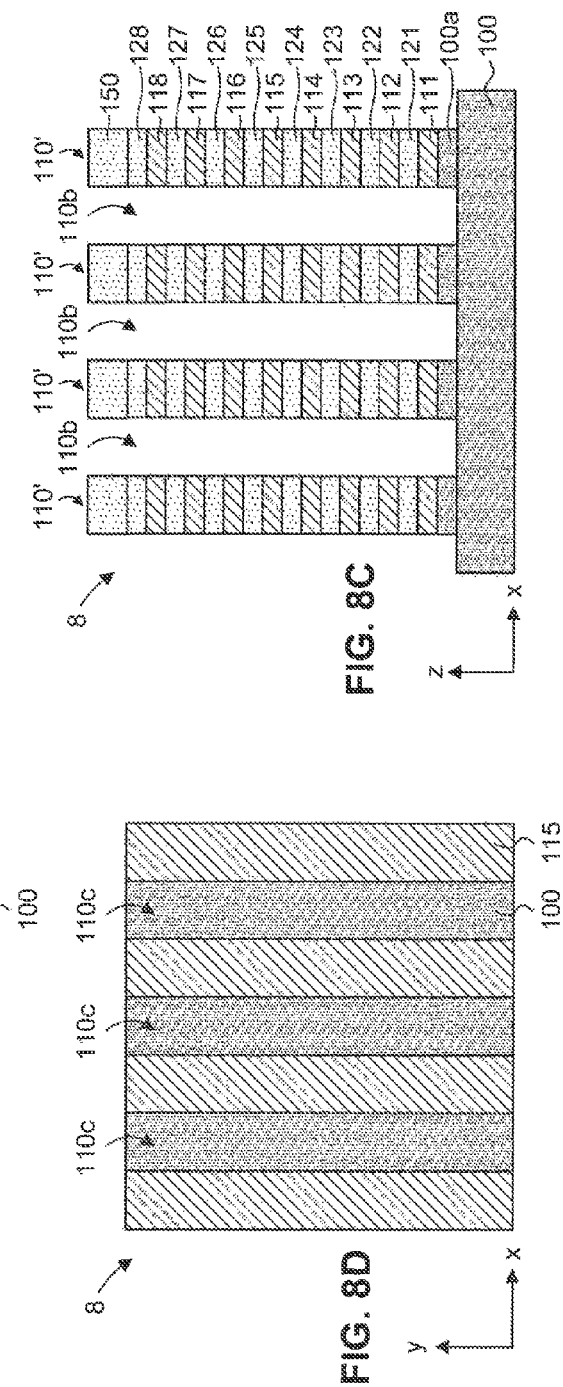
FIG. 8A
FIG. 8B
FIG. 8C
FIG. 8D

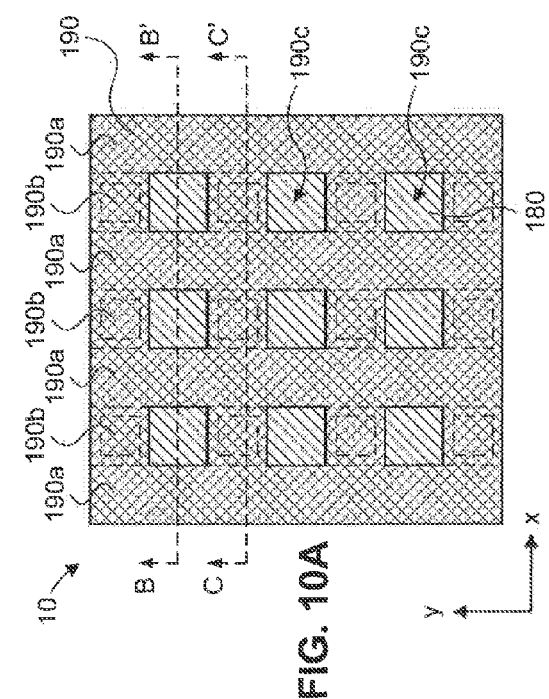
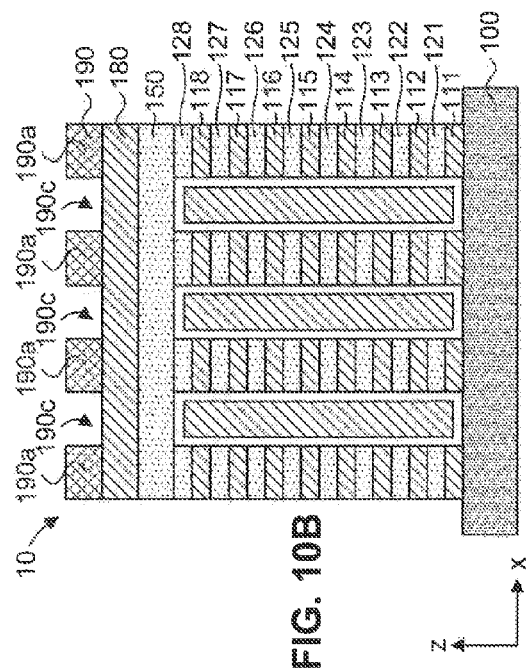
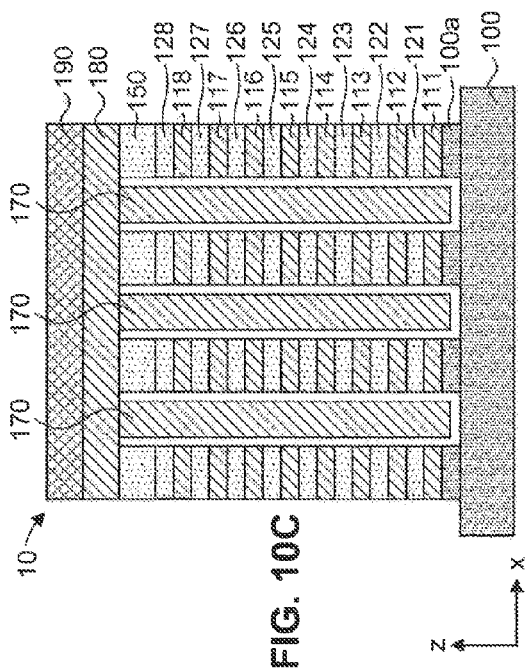

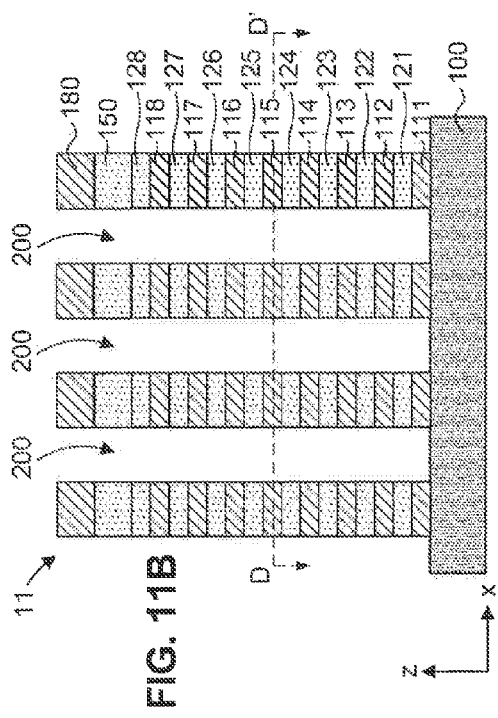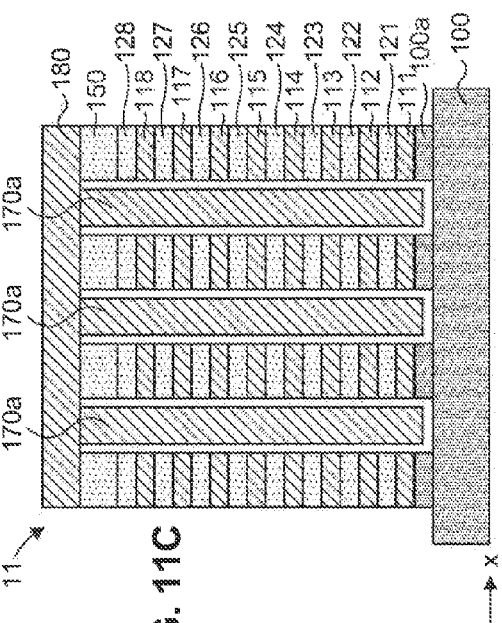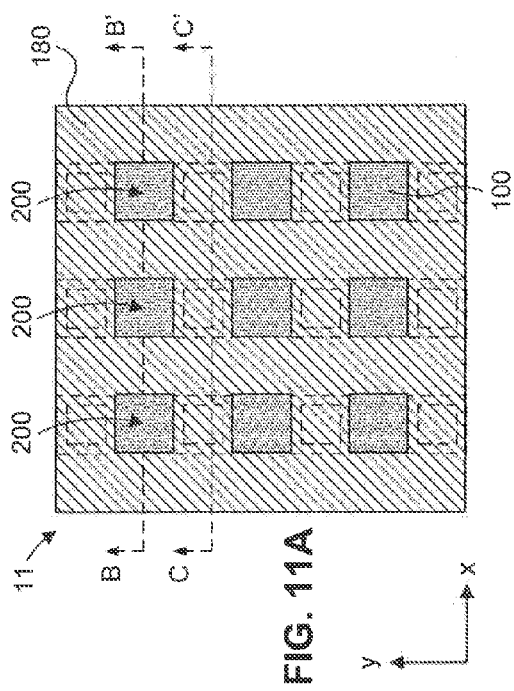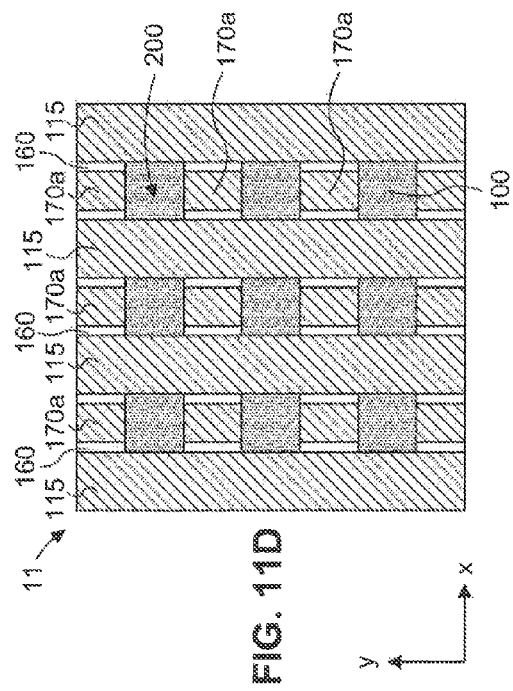

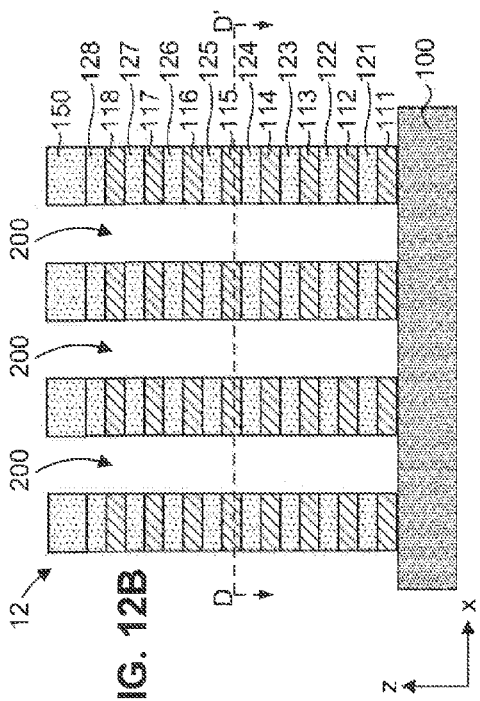
FIG. 12B
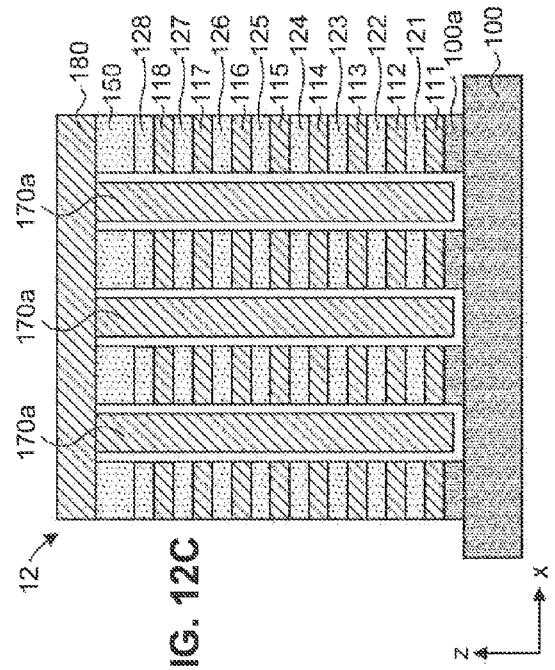
FIG. 12C
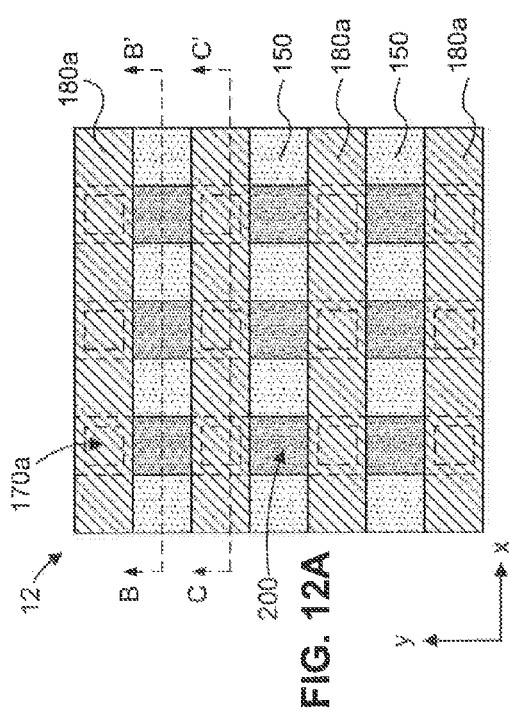
FIG. 12A
FIG. 12D

MULTI-LAYER MEMORY ARRAY AND MANUFACTURING METHOD OF THE SAME

FIELD OF THE DISCLOSURE

The present disclosure relates to a multi-layer memory array and a manufacturing method of the same, and more particularly, to a multi-layer memory array that includes a hard mask layer.

BACKGROUND OF THE DISCLOSURE

A three-dimensional (3D) multi-layer memory array is constructed with a plurality of ridge-shaped multi-layer stacks parallel to each other. As dimensions of the 3D multi-layer memory array scale down, the density of the multi-layer stacks increases, and the aspect ratio (i.e., the ratio of height to width) of the multi-layer stacks increases. Manufacture of the ridge-shaped multi-layer stacks with increased aspect ratio presents various challenges.

SUMMARY

According to an embodiment of the disclosure, a method for manufacturing a memory array includes forming a multi-layer stack on a surface of a substrate, and forming a plurality of first through holes through the multi-layer stack along a vertical direction of the multi-layer stack from a top surface of the multi-layer stack to the surface of the substrate. The first through holes are arranged in equally spaced rows along a first direction along the surface of the substrate, and equally spaced columns along a second direction orthogonal to the first direction. The method also includes forming a plurality of sacrificial pillars to fill in the first through holes, and forming a hard mask layer over the multi-layer stack with the sacrificial pillars. The hard mask layer includes a plurality of hard mask through holes exposing regions of the multi-layer stack between neighboring sacrificial pillars in each column of sacrificial pillars. The method further includes forming a plurality of second through holes through the multi-layer stack along the vertical direction of the multi-layer stack from the top surface of the multi-layer stack to the surface of the substrate, and removing the sacrificial pillars filling in the first through holes. The second through holes are vertically aligned with the hard mask through holes. The second through holes are connected with the first through holes to form a plurality of trenches extending along the second direction. The trenches divide the multi-layer stack into a plurality of ridge-shaped stacks extending along the second direction.

According to another embodiment of the disclosure, a memory array includes a plurality of ridge-shaped multi-layer stacks extending along a first direction, and a hard mask layer formed on top of the plurality of ridge-shaped multi-layer stacks. The hard mask layer includes a plurality of stripes vertically aligned with the plurality of ridge-shaped multi-layer stacks, respectively, a plurality of bridges connecting adjacent ones of the stripes along a second direction orthogonal to the first direction, and a plurality of hard mask through holes between the plurality of bridges and the plurality of stripes. The memory array also includes a memory layer disposed within trenches between the plurality of ridge-shaped multi-layer stacks, and covering sidewalls of the ridge-shaped multi-layer stacks, a plurality of conductive pillars disposed within the trenches, extending along a vertical direction of the ridge-shaped multi-layer stacks, and vertically aligned with the plurality of hard mask through holes, respectively, and a plurality of conductive stripes disposed on the hard mask layer and extending along the second direction, each conductive stripe being connected with a row of conductive pillars formed along the second direction.

According to a further embodiment of the disclosure, a memory array includes a plurality of ridge-shaped multi-layer stacks extending along a first direction, and a hard mask layer formed on top of the plurality of ridge-shaped multi-layer stacks. The hard mask layer includes a plurality of stripes vertically aligned with the plurality of ridge-shaped multi-layer stacks, respectively, and a plurality of bridges connecting adjacent ones of the stripes along a second direction orthogonal to the first direction. The memory array also includes a memory layer disposed within trenches between the plurality of ridge-shaped multi-layer stacks, and covering sidewalls of the ridge-shaped multi-layer stacks, a plurality of conductive pillars disposed within the trenches, extending along a vertical direction of the ridge-shaped multi-layer stacks, and a plurality of conductive stripes disposed on the hard mask layer and extending along the second direction. Each row of conductive pillars formed along the second direction is overlaid with and connected to more than one of the conductive stripes.

BRIEF DESCRIPTION OF THE DRAWINGS

FIG. 1 illustrates construction at a preliminary stage of a manufacturing process of a memory array, according to an illustrated embodiment of the disclosure.

FIGS. 2A-2C illustrate construction at a manufacturing stage subsequent to that of FIG. 1 according to the illustrated embodiment.

FIGS. 4A-4C illustrate construction at a manufacturing stage subsequent to that of FIGS. 3A-3C, according to the illustrated embodiment.

FIGS. 5A-5C illustrate construction at a manufacturing stage subsequent to that of FIGS. 4A-4C, according to the illustrated embodiment.

FIGS. 6A-6C illustrate construction at a manufacturing stage subsequent to that of FIGS. 5A-5C, according to the illustrated embodiment.

FIGS. 8A-8E illustrate construction at a manufacturing stage subsequent to that of FIGS. 7A-7C, according to the illustrated embodiment.

FIGS. 10A-10C illustrate construction at a manufacturing stage subsequent to that of FIGS. 9A-9D, according to the illustrated embodiment.

FIGS. 11A-11D illustrate construction at a manufacturing stage subsequent to that of FIGS. 10A-10C, according to the illustrated embodiment.

FIGS. 12A-12E illustrate construction at a final manufacturing stage subsequent to that of FIGS. 11A-11D, according to the illustrated embodiment.

DETAILED DESCRIPTION

Figure 3A:
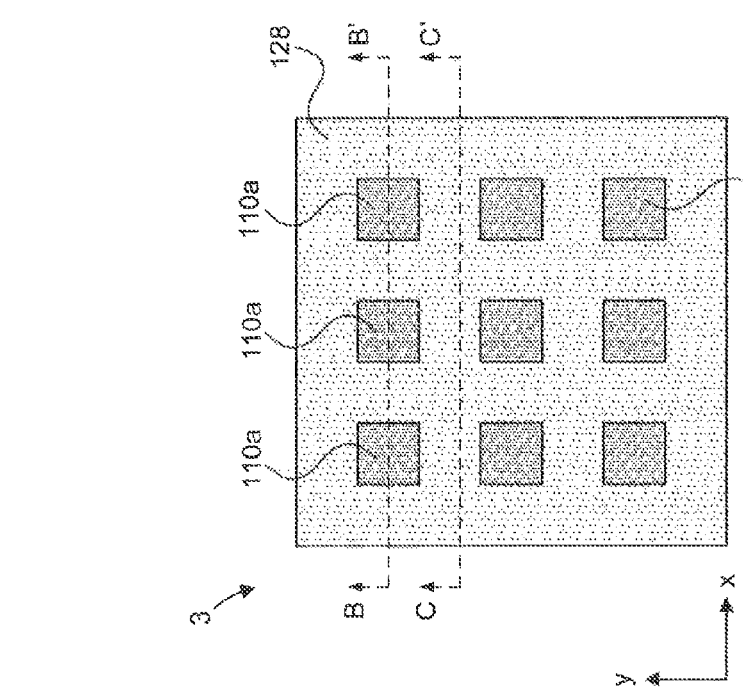
FIGS. 3A-3C illustrate construction at a manufacturing stage subsequent to that of FIGS. 2A-2C, according to the illustrated embodiment.

Reference will now be made in detail to the present embodiments, examples of which are illustrated in the accompanying drawings. Wherever possible, the same reference numbers will be used throughout the drawings to refer to the same or like parts.

FIG. 1 is a perspective view of a construction 1 at a preliminary stage of a manufacturing process of a memory array, according to an illustrated embodiment of the disclosure. Referring to FIG. 1, a multi-layer stack 110 is formed on a semiconductor substrate 100. Stack 110 includes a plurality of conductive layers 111-118, and a plurality of insulating layers 121-128 alternately stacked with conductive layer 111-118 on substrate 100 along a Z-direction illustrated in FIG. 1, with conductive layer 111 being located at the bottom of stack 110, and insulating layer 128 being located at the top of stack 110. Conductive layers 111-118 can be formed of a conductive semiconductor material, such as n-type polysilicon, or n-type epitaxial single crystal silicon, doped with phosphorus or arsenic at a doping concentration of about $10^{17}$ to $10^{20}$ atoms/cm$^3$. Alternatively, conductive layers 111-118 can be formed of p-type polysilicon, or p-type epitaxial single crystal silicon, doped with boron at a doping concentration of about $10^{17}$ to $10^{20}$ atoms/cm$^3$. Still alternatively, conductive layers 111-118 can be formed of un-doped semiconductor material, such as un-doped polysilicon. When conductive layers 111-118 are formed of un-doped polysilicon, a grain size of the un-doped polysilicon can be about 400 nm to 600 nm, and a sheet resistance of the un-doped polysilicon can be about $10^7$ ohm/square to $10^{11}$ ohm/square. The thickness of each one of conductive layers 111-118 can be about 30 nm to 40 nm. Insulating layers 121-128 can be formed of a dielectric material such as oxide, nitride, oxynitride, silicate, or others. The thickness of each one of insulating layers 121-128 can be about 20 nm to 40 nm. Conductive layers 111-118 and insulating layers 121-128 can be formed by, for example, a low pressure chemical vapor deposition (LPCVD) process.

FIGS. 2A-2C illustrate a construction 2 at a manufacturing stage subsequent to that of FIG. 1, according to the illustrated embodiment. FIG. 2A is a top view of construction 2. FIG. 2B is a cross-sectional view of construction 2 taken along line B-B' of FIG. 2A. FIG. 2C is a cross-sectional view of construction 2 taken along line C-C' of FIG. 2A. Referring to FIGS. 2A-2C, a patterned hard mask layer 130 is formed over stack 110, i.e., on a top surface of insulating layer 128. Patterned hard mask layer 130 includes a plurality of through holes 130a extending along the Z-direction. Through holes 130 are arranged in rows along an X-direction, and are arranged in columns along a Y-direction. Through holes 130a are each formed in a square shape having the same size. The rows of through holes 130a are equally spaced apart from each other by a distance d1. The columns of through holes 130a are equally spaced apart from each other by a distance d2. Distance d1 can be equal to distance d2. Hard mask layer 130 can include an advanced patterning film (APF), and can be formed by a chemical vapor deposition (CVD) process to deposit the APF over the entire top surface of stack 110, a photolithography process that defines portions of the APF where through holes 130a are to be formed, and an etching process that removes the defined portions.

Figure 3B:
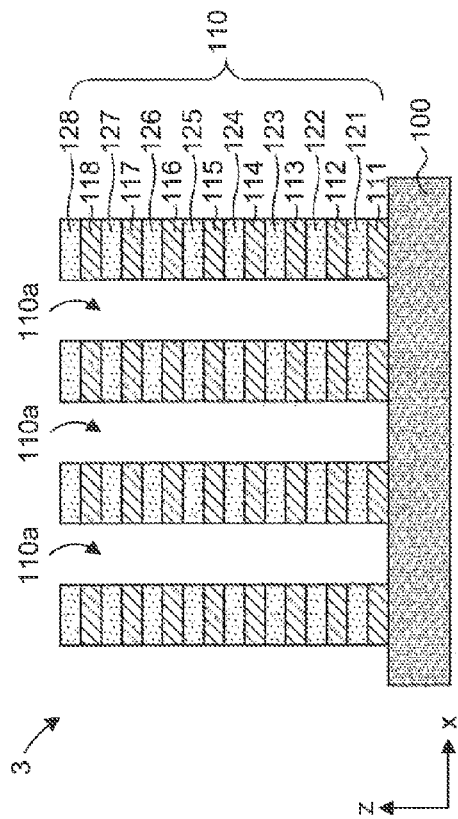
Figure 3C:
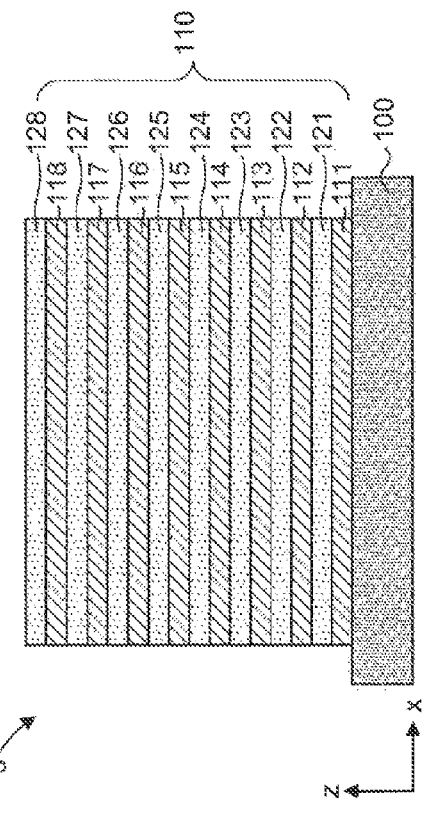

FIGS. 3A-3C illustrate a construction 3 at a manufacturing stage subsequent to that of FIGS. 2A-2C, according to the illustrated embodiment. FIG. 3A is a top view of construction 3. FIG. 3B is a cross-sectional view of construction 3 taken along line B-B' of FIG. 3A. FIG. 3C is a cross-sectional view of construction 3 taken along line C-C' of FIG. 3A. Referring to FIGS. 3A-3C, stack 110 is etched by using hard mask layer 130 as an etching mask, to form through holes 110a extending along the Z-direction until regions of substrate 100 is exposed by through holes 110a. In FIG. 3B, unetched portions of stack 110 behind through holes 110a are not shown, in order to more clearly show through holes 110a. Each one of through holes 110a is vertically aligned with respective one of through holes 130a. Stack 110 can be etched by an anisotropic etching process such as, for example, a reactive ion etching (RIE) process. After the etching process, hard mask layer 130 is removed. Although the top view in FIG. 3A shows that through holes 110a are square, those of ordinary skill in the art will now appreciate that, in reality, the top view of the through holes 110a could be circular due to rounding of sidewalls of through holes 110a during the anisotropic etching process for forming through holes 110a.

FIGS. 4A-4C illustrate a construction 4 at a manufacturing stage subsequent to that of FIGS. 3A-3C, according to the illustrated embodiment. FIG. 4A is a top view of construction 4. FIG. 4B is a cross-sectional view of construction 4 taken along line B-B' of FIG. 4A. FIG. 4C is a cross-sectional view of construction 4 taken along line C-C' of FIG. 4A. Referring to FIGS. 4A-4C, sacrificial pillars 140 are formed in corresponding through holes 110a. Sacrificial pillars 140 can be formed of silicon nitride $Si_3N_4$. This is because $Si_3N_4$ has good etching selectivity and strength to withstand a capillary force caused by a wet cleaning solution used in a subsequent wet cleaning process that described below. Sacrificial pillars 140 can be formed by a LPCVD process that deposits a silicon nitride layer covering the top surface of insulating layer 128 and filling in through holes 110a, and an etching back process that removes a top portion of the silicon nitride layer that covers the top surface of insulating layer 128 until the top surface of insulating layer 128 is exposed.

FIGS. 5A-5C illustrate a construction 5 at a manufacturing stage subsequent to that of FIGS. 4A-4C, according to the illustrated embodiment. FIG. 5A is a top view of construction 5. FIG. 5B is a cross-sectional view of construction 5 taken along line B-B' of FIG. 5A. FIG. 5C is a cross-sectional view of construction 5 taken along line C-C' of FIG. 5A. Referring to FIGS. 5A-5C, a hard mask layer 150 is formed over the entire construction 4 of FIGS. 4A-4C. Hard mask layer 150 can be formed of silicon, silicon oxide, or silicon oxynitride, by a LPCVD process.

FIGS. 6A-6C illustrate a construction 6 at a manufacturing stage subsequent to that of FIGS. 5A-5C, according to the illustrated embodiment. FIG. 6A is a top view of construction 6. FIG. 6B is a cross-sectional view of construction 6 taken along line B-B' of FIG. 6A. FIG. 6C is a cross-sectional view of construction 6 taken along line C-C' of FIG. 6A. Referring to FIGS. 6A-6C, a masking layer 155 is formed over hard mask layer 150. Masking layer 155 is then patterned to form a plurality of stripes 155a, a plurality of bridges 155b, and a plurality of through holes 155c. The plurality of stripes 155a extend along the Y-direction and overlay spaces between columns of sacrificial pillars 140. The plurality of bridges 155b connect neighboring stripes 155a, extend along the X-direction, and overlay sacrificial pillars 140. The plurality of through holes 155c are formed between the plurality of bridges 155b. Masking layer 155 is formed of photoresist or an APF layer. The patterning of masking layer 155 can be performed by a photolithography process that defines portions of masking layer 155 to be removed (i.e., to form through holes 155c), and an etching process that removes the defined portions.

Figure 6D:
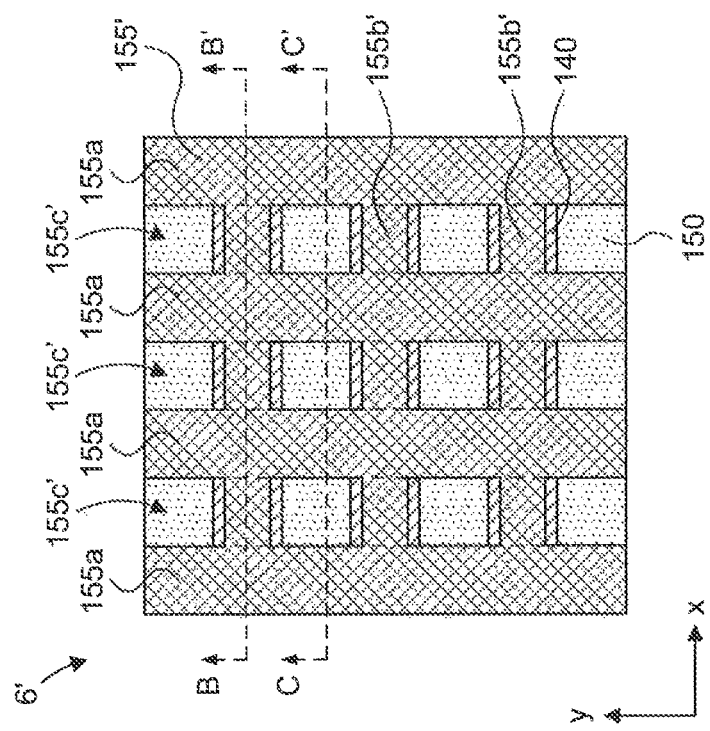
FIG. 6D illustrates a top view of construction at a manufacturing stage subsequent to that of FIGS. 5A-5C, according to another embodiment of the disclosure.

FIG. 6D illustrates a top view of a construction 6' at a manufacturing stage subsequent to that of FIGS. 5A-5C, according to another embodiment of the disclosure. Referring to FIG. 6D, bridges 155b' overlay only central portions of sacrificial pillars 140. As a result, the upper and lower edges of sacrificial pillars 140 along the Y-direction are exposed by through holes 155c'.

Figure 7B:
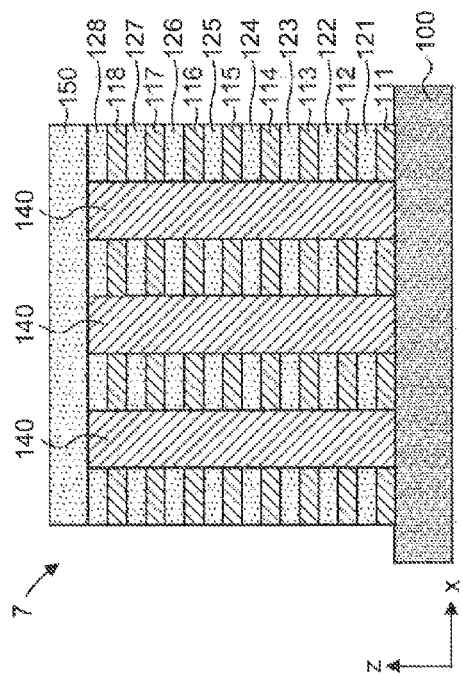
FIGS. 7A-7C illustrate construction at a manufacturing stage subsequent to that of FIGS. 6A-6C, according to the illustrated embodiment.
Figure 7C:
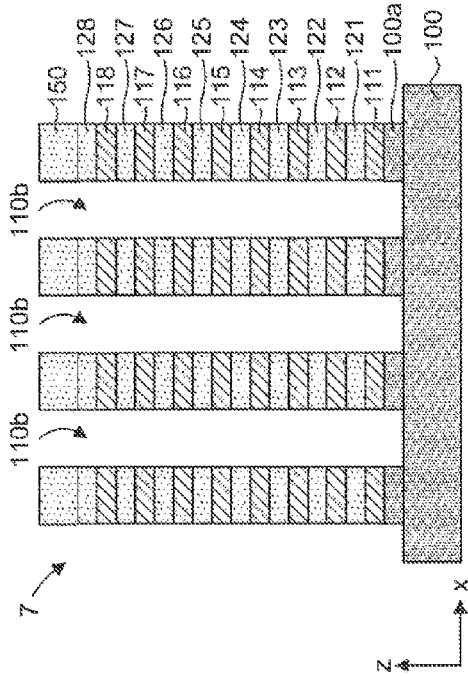
Figure 7A:
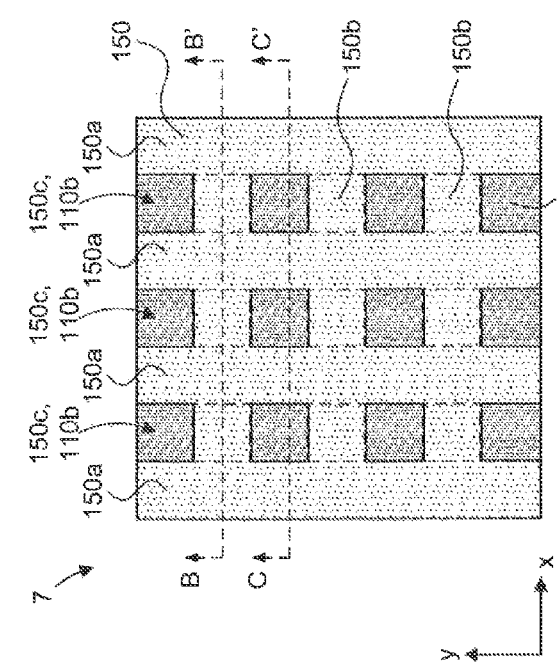

FIGS. 7A-7C illustrate a construction 7 at a manufacturing stage subsequent to that of FIGS. 6A-6C, according to the illustrated embodiment. FIG. 7A is a top view of construction 7. FIG. 7B is a cross-sectional view of construction 7 taken along line B-B' of FIG. 7A. FIG. 7C is a cross-sectional view of construction 7 taken along line C-C' of FIG. 7A. Referring to FIGS. 7A-7C, stack 110 is etched by using masking layer 155 as an etching mask, to form through holes 110b extending along the Z-direction to expose substrate 100. In FIG. 7C, sacrificial pillars 140 located behind respective through holes 110b are not shown, in order to more clearly show through holes 110b. As a result of the etching process, hard mask layer 150 includes a plurality of stripes 150a extending along the Y-direction and covering spaces between columns of sacrificial pillars 140, a plurality of bridges 150b connecting neighboring stripes 150a, extending along the X-direction, and covering top surfaces (i.e., the top surfaces in the Z-direction) of sacrificial pillars 140, and a plurality of through holes 150c between the plurality of bridges 150b. Each one of through holes 110b is vertically aligned with a respective one of through holes 150c along the Z-direction. Stack 110 can be etched by an anisotropic etching process such as, for example, a reactive ion etching (RIE) process. Referring to FIG. 7C, portions of substrate 100 exposed by through holes 110b are also etched to form structures 100a.

Figure 8E:
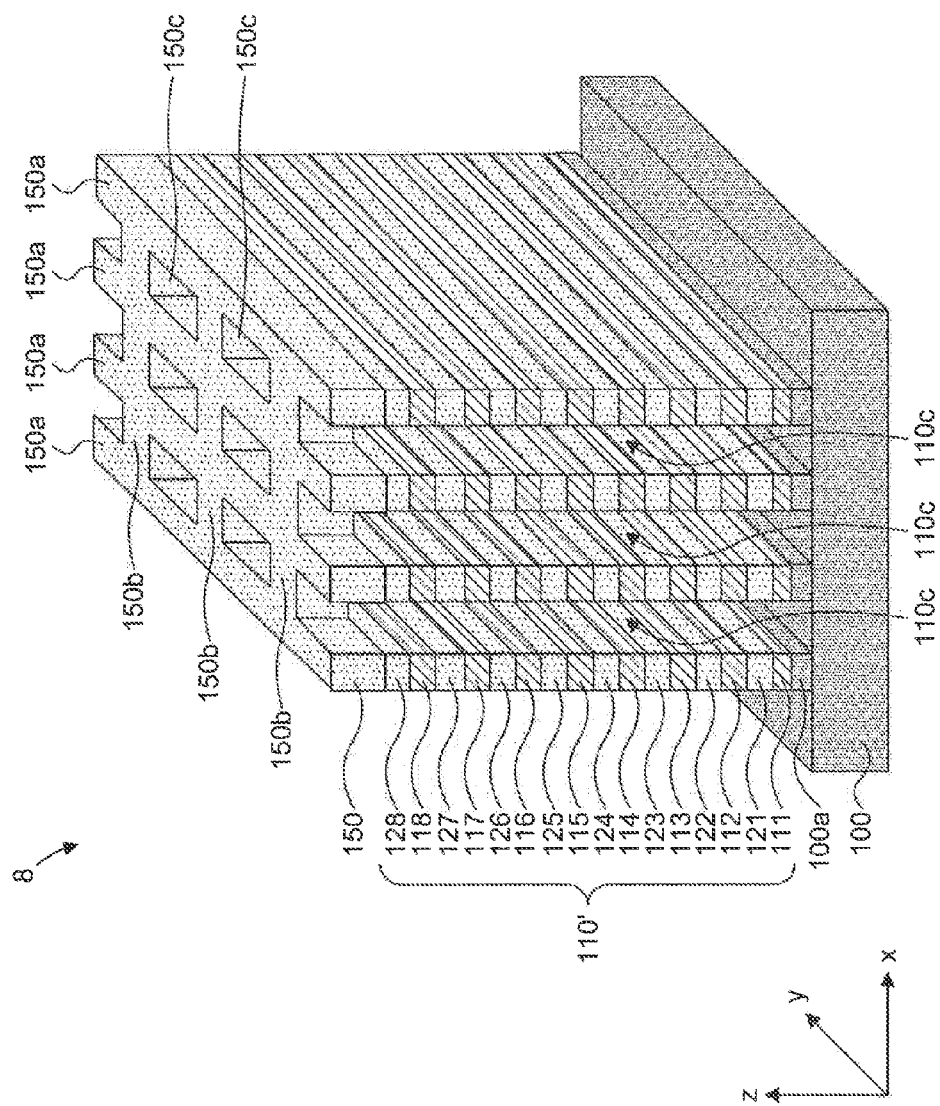

FIGS. 8A-8E illustrate a construction 8 at a manufacturing stage subsequent to that of FIGS. 7A-7C, according to the illustrated embodiment. FIG. 8A is a top view of construction 8. FIG. 8B is a cross-sectional view of construction 8 taken along line B-B' of FIG. 8A. FIG. 8C is a cross-sectional view of construction 8 taken along line C-C' of FIG. 8A. FIG. 8D is a sectional view of construction 8 taken along line D-D' of FIG. 8B. FIG. 8E is a perspective view of construction 8. Referring to FIGS. 8A-8E, sacrificial pillars 140 are removed to leave through holes 110a unfilled. Through holes 110a are connected with adjacent through holes 110b to form trenches 110c that divide stack 110 to form a plurality of ridge-shaped stacks 110' extending along the Y direction. In FIG. 8C, unetched portions of hard mask layer 150 behind through holes 110b are not shown, in order to more clearly show through holes 110b. Ridge-shaped stacks 110' are vertically aligned with respective ones of stripes 150a of hard mask layer 150. Sacrificial pillars 140 can be removed by a wet cleaning process. For example, construction 7 of FIGS. 7A-7C can be immersed in a solution, such as hot phosphoric acid, so that the solution enters through holes 110b to contact sacrificial pillars 140, and to etch and remove sacrificial pillars 140. During the wet cleaning process, the plurality of bridges 150b are not removed. Instead, the plurality of bridges 150b remain as supports between the adjacent ridge-shaped stacks 110', such that the adjacent ridge-shaped stacks 110' will not touch each other due to a capillary force caused by the solution used in the wet cleaning process.

Figure 9A:
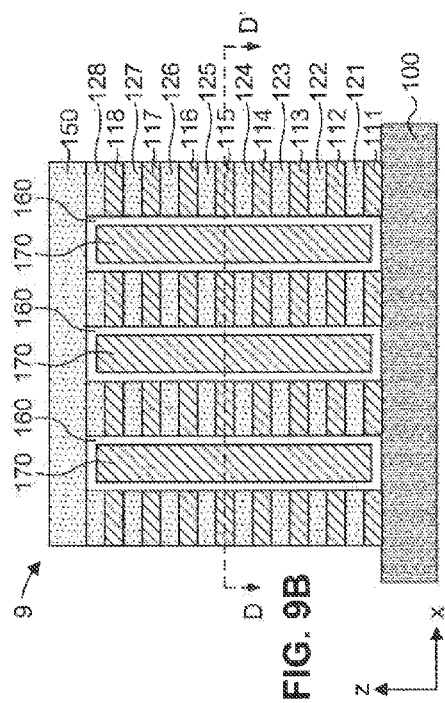
FIGS. 9A-9D illustrate construction at a manufacturing stage subsequent to that of FIGS. 8A-8E, according to the illustrated embodiment.
Figure 9B:
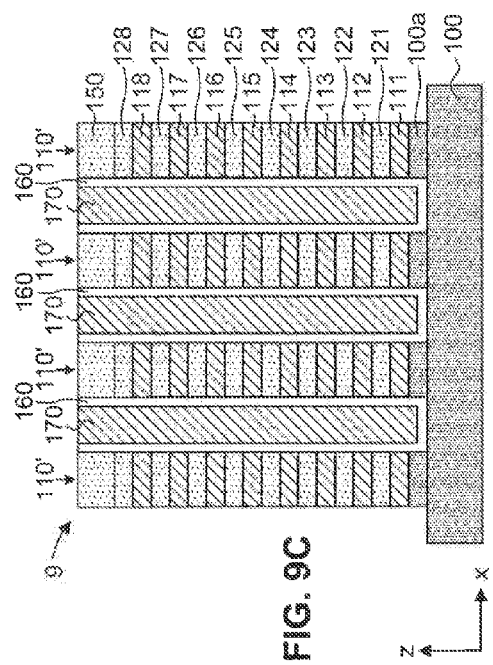
Figure 9D:
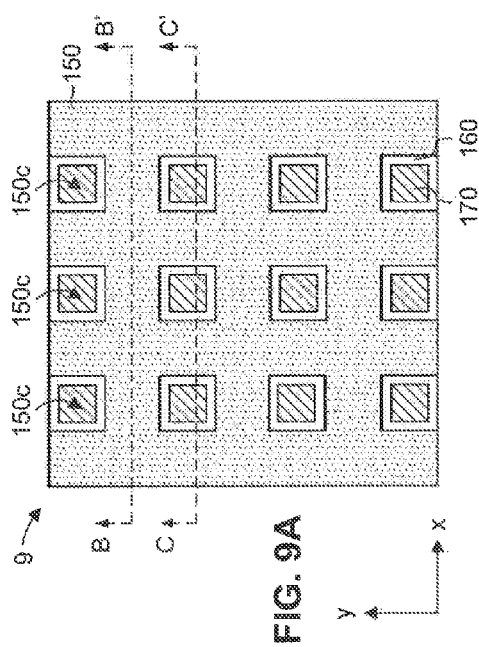
Figure 9C:
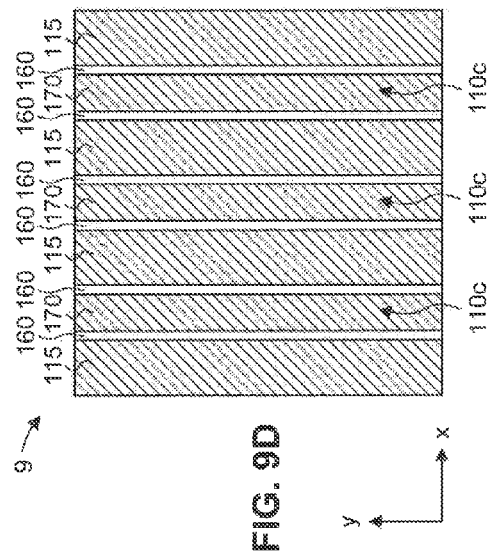

FIGS. 9A-9D illustrate a construction 9 at a manufacturing stage subsequent to that of FIGS. 8A-8E, according to the illustrated embodiment. FIG. 9A is a top view of construction 9. FIG. 9B is a cross-sectional view of construction 9 taken along line B-B' of FIG. 9A. FIG. 9C is a cross-sectional view of construction 9 taken along line C-C' of FIG. 9A. FIG. 9D is a sectional view of construction 9 taken along line D-D' of FIG. 9B. Referring to FIGS. 9A-9D, a memory layer 160 is formed to coat trenches 110c between ridge-shaped stacks 110'. That is, memory layer 160 is formed on the side walls of ridge-shaped stacks 110', exposed portions of substrate 100 exposed by trenches 110c, and exposed portions of hard mask layer 150. As illustrated in FIG. 9A, memory layer 160 is also formed on the side walls of through holes 150c of hard mask layer 150. Memory layer 160 can be formed of a composite layer (i.e., an ONO layer) including a silicon oxide layer, a silicon nitride layer, and a silicon oxide layer, by a LPCVD process. After forming memory layer 160, a conductive material is formed on the entire structure formed with memory layer 160, filling in trenches 110c and through holes 150c coated with memory layer 160. Then, a top layer of the conductive material and a top layer of memory layer 160 are removed by etching, to expose hard mask layer 150. As a result, a plurality of conductive ridges 170 extending along the Y-direction are formed. Conductive ridges 170 can be formed of an electrically conductive material, such as p+-type polysilicon doped with boron at a doping concentration of about $10^{17}$ to $10^{19}$ atoms/cm$^3$, n+-type polysilicon doped with phosphorus or arsenic at a doping concentration of about $10^{17}$ to $10^{19}$ atoms/cm$^3$, or un-doped polysilicon. Alternatively, conductive ridges 170 can be formed of a silicide such as TiSi, CoSi, or SiGe, an oxide semiconductor such as InZnO or InGaZnO, a metal such as Al, Cu, W, Ti, Co, Ni, TiN, TaN, or TaAlN, or a combination of two or more of these materials. Conductive ridges 170 can be formed by a LPCVD process.

FIGS. 10A-10C illustrate a construction 10 at a manufacturing stage subsequent to that of FIGS. 9A-9D, according to the illustrated embodiment. FIG. 10A is a top view of construction 10. FIG. 10B is a cross-sectional view of construction 10 taken along line B-B' of FIG. 10A. FIG. 10C is a cross-sectional view of construction 10 taken along line C-C' of FIG. 10A. Referring to FIGS. 10A-10C, a conductive layer 180 is formed over construction 9 of FIGS. 9A-9D. Conductive layer 180 can be formed of an electrically conductive material, such as p+-type polysilicon doped with boron at a doping concentration of about $10^{17}$ to $10^{19}$ atoms/cm$^3$, n+-type polysilicon doped with phosphorus or arsenic at a doping concentration of about $10^{17}$ to $10^{19}$ atoms/cm$^3$, or un-doped polysilicon. Alternatively, conductive layer 180 can be a silicide such as TiSi, CoSi, or SiGe, an oxide semiconductor such as InZnO or InGaZnO, a metal such as Al, Cu, W. Ti, Co, Ni, TiN, TaN, or TaAlN, or a combination of two or more of these materials. Conductive layer 180 can be formed of the same material as that of conductive ridges 170. Conductive layer 180 can be formed by a LPCVD process. Then, a patterned hard mask layer 190 is formed over conductive layer 180. Patterned hard mask layer 190 includes a plurality of stripes 190a extending along the Y-direction. The plurality of stripes 190a are vertically aligned (in the Z-direction) with the plurality of ridge-shaped stacks 110'. Patterned hard mask layer 190 also includes a plurality of bridges 190b between the plurality of stripes 190a along the X-direction to be vertically aligned with portions of conductive ridges 170 that are exposed by through holes 150c of hard mask layer 150. Patterned hard mask layer 190 further includes a plurality of through holes 190c between the plurality of bridges 190b to expose regions of conductive layer 180. Patterned hard mask layer 190 can be formed of an APE Patterned hard mask layer 190 can be formed by a LPCVD process that deposits an APF over the entire surface of conductive layer 180, a photolithography process that defines portions of the APF to be removed, and an etching process to remove the defined portions.

FIGS. 11A-11D illustrate a construction 11 at a manufacturing stage subsequent to that of FIGS. 10A-10C, according to the illustrated embodiment. FIG. 11A is a top view of construction 11. FIG. 11B is a cross-sectional view of construction 11 taken along line B-B' of FIG. 11A. FIG. 11C is a cross-sectional view of construction 11 taken along line C-C' of FIG. 11A. FIG. 11D is a sectional view of construction 11 taken along line D-D' of FIG. 11B. Referring to FIGS. 11A-11D, construction 10 of FIGS. 10A-10C is etched by using patterned hard mask layer 190 as an etching mask, to form through holes 200 extending along the Z-direction to expose substrate 100. In FIG. 11B, unetched portions of conductive layer 180, hard mask layer 150, conductive ridges 170, and memory layer 160 located behind through holes 200 are not shown, in order to more clearly show through holes 200. Each one of through holes 200 is vertically aligned with a respective one of through holes 190c of patterned hard mask layer 190. Through holes 200 break each of conductive ridges 170 into a plurality of conductive pillars 170a. Construction 10 can be etched by an anisotropic etching process such as, for example, a reactive ion etching (RIE) process. After the etching process, patterned hard mask layer 190 is removed by a wet etching process.

Figure 12E:
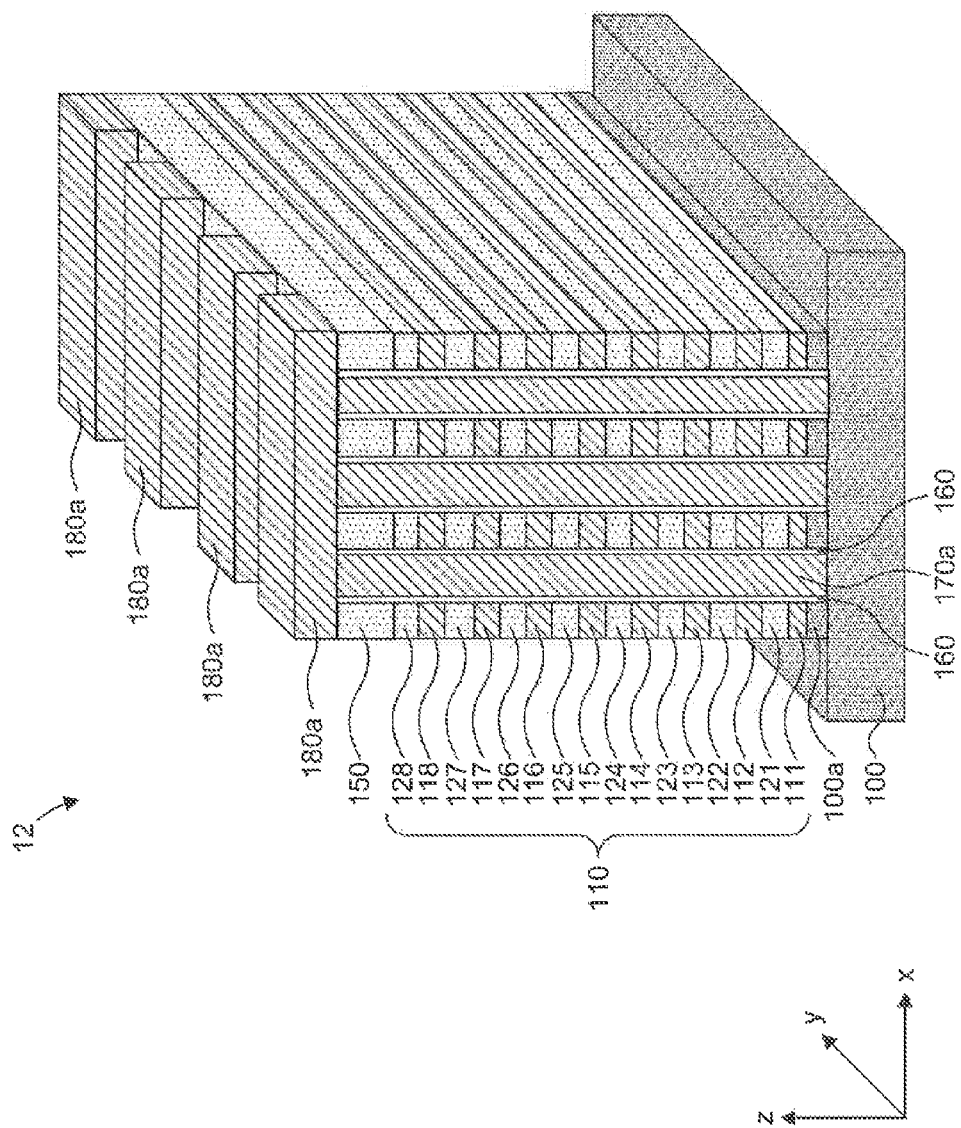

FIGS. 12A-12E illustrate a construction 12 at a final manufacturing stage subsequent to that of FIGS. 11A-11D, according to the illustrated embodiment. FIG. 12A is a top view of construction 12. FIG. 12B is a cross-sectional view of construction 12 taken along line B-B' of FIG. 12A. FIG. 12C is a cross-sectional view of construction 12 taken along line C-C' of FIG. 12A. FIG. 12D is a sectional view of construction 12 taken along line D-D' of FIG. 12B. FIG. 12E is a perspective view of construction 12. Referring to FIGS. 12A-12E, conductive layer 180 is patterned to form a plurality of stripes 180a extending along the X-direction. Each stripe 180a is vertically (in the Z-direction) aligned with and connects to a row of conductive pillars 170a along the X-direction. The patterning of conductive layer 180 can be performed by a photolithography process that defines portions of conductive layer 180 to be removed, and an etching process that removes the defined portions.

In construction 12, each conductive pillar 170a functions as a gate. Each conductive stripe 180a functions as a word line. Each ridge-shaped stack 110' functions as a bit line. Each conductive layer 111-118 in each ridge-shaped stack 110' functions as a channel.

While each ridge-shaped stack 110' illustrated in FIGS. 12A-12E includes eight conductive layers and eight insulating layers, the number of conductive layers and insulating layers can be varied. In addition, while construction 12 illustrated in FIGS. 12A-12E includes four ridge-shapes stacks 110' and four stripes 180a, the number of stackes and stripes can be varied.

Figure 13:
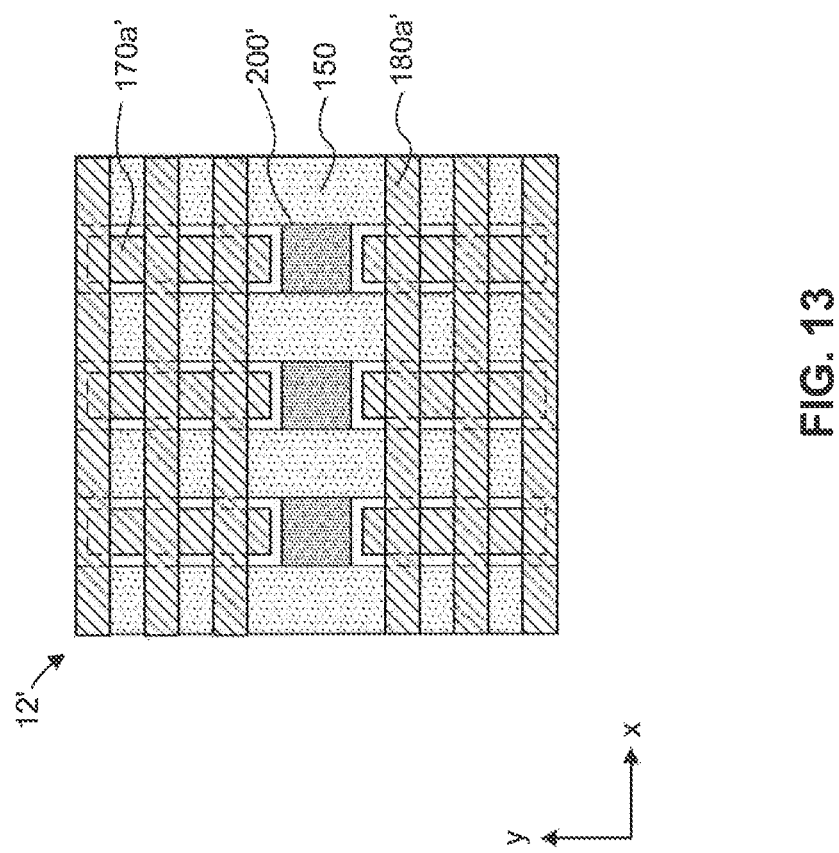
FIG. 13 illustrates construction at a final manufacturing stage of a manufacturing process of a memory array, according to another illustrated embodiment.

FIG. 13 is a top view of a construction 12' at a final manufacturing stage of a manufacturing process of the memory array, according to another illustrated embodiment. Referring to FIG. 13, the number of through holes 200' is fewer than that of the embodiment illustrated in FIG. 12A, such that conductive pillars 170a' extend longer along the Y direction than conductive pillars 170a illustrated in FIG. 12A. Then, more than one of conductive stripes 180a', for example, three (3) conductive stripes 180a', are formed to overlay and connect to each row of conductive pillars 170a along the X direction. In addition, the plurality of bridges 150b in hard mask layer 150 are removed before forming conductive stripes 180a'. The portions of memory layer 160 formed on the side walls of bridges 150 are also removed. As a result, the length of the gates (implemented by conductive pillars 170a) along the Y direction can be increased, and more than one word line (implemented by conductive stripes 180a') can be connected to each gate.

Construction 12' illustrated in FIG. 13 represents an ideal construction when through holes 200' are aligned with the underlying structure. When through holes 200' are not aligned with the underlying structure due to, for example, misalignment in a photolithography process, through holes 200' can slightly shift in the X-direction. In such case, part of memory layer 160 can remain on the sidewalls of ridge-shaped stacks 110'.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A memory array, comprising:
    a plurality of ridge-shaped multi-layer stacks extending along a first direction;
    a hard mask layer formed on top of the plurality of ridge-shaped multi-layer stacks, the hard mask layer including a plurality of stripes vertically aligned with the plurality of ridge-shaped multi-layer stacks, respectively, a plurality of bridges connecting adjacent ones of the stripes along a second direction orthogonal to the first direction, and a plurality of hard mask through holes between the plurality of bridges and the plurality of stripes;
    a memory layer disposed within trenches between the plurality of ridge-shaped multi-layer stacks, and covering sidewalls of the ridge-shaped multi-layer stacks;
    a plurality of conductive pillars disposed within the trenches, extending along a vertical direction of the ridge-shaped multi-layer stacks, and vertically aligned with the plurality of hard mask through holes, respectively; and
    a plurality of conductive stripes disposed on the hard mask layer and extending along the second direction, each conductive stripe being connected with a row of conductive pillars formed along the second direction.

2. The memory array of claim 1, wherein the hard mask layer is formed of silicon, silicon oxide, or silicon oxynitride.

3. The memory array of claim 1, wherein each one of the plurality of ridge-shaped multi-layer stacks includes a plurality of conductive layers and a plurality of insulating layers alternately stacked along the vertical direction.

4. The memory array of claim 3, wherein the conductive layer is formed of polysilicon.

5. The memory array of claim 3, wherein the insulating layer is formed of a dielectric material selected from oxide, nitride, oxynitride, and silicate.

6. The memory array of claim 1, wherein the memory layer includes a silicon oxide layer, a silicon nitride layer, and a silicon oxide layer.

7. The memory array of claim 1, wherein the conductive pillars are formed of an electrically conductive material selected from polysilicon, silicides, oxide semiconductors, metals, or a combination thereof.

8. The memory array of claim 1, wherein the conductive stripes are formed of an electrically conductive material selected from polysilicon, silicides, oxide semiconductors, metals, or a combination thereof.

9. A memory array, comprising:

a plurality of ridge-shaped multi-layer stacks extending along a first direction;

a hard mask layer formed on top of the plurality of ridge-shaped multi-layer stacks, the hard mask layer including a plurality of stripes vertically aligned with the plurality of ridge-shaped multi-layer stacks, respectively, and a plurality of bridges connecting adjacent ones of the stripes along a second direction orthogonal to the first direction;

a memory layer disposed within trenches between the plurality of ridge-shaped multi-layer stacks, and covering sidewalls of the ridge-shaped multi-layer stacks;

a plurality of conductive pillars disposed within the trenches, extending along a vertical direction of the ridge-shaped multi-layer stacks; and a plurality of conductive stripes disposed on the hard mask layer and extending along the second direction, wherein each row of conductive pillars formed along the second direction is overlaid with and connected to more than one of the conductive stripes.

\* \* \* \* \*